United States Patent
Lee

(10) Patent No.: US 10,726,935 B2
(45) Date of Patent: Jul. 28, 2020

(54) MEMORY DEVICE AND OPERATING METHOD THEREOF

(71) Applicant: SK hynix Inc., Icheon-si Gyeonggi-do (KR)

(72) Inventor: Wan Seob Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/422,684

(22) Filed: May 24, 2019

(65) Prior Publication Data

US 2020/0082899 A1 Mar. 12, 2020

(30) Foreign Application Priority Data

Sep. 7, 2018 (KR) .................. 10-2018-0106926

(51) Int. Cl.
| | |
|---|---|
| *G11C 29/38* | (2006.01) |
| *G11C 16/08* | (2006.01) |
| *G11C 16/10* | (2006.01) |
| *G11C 16/04* | (2006.01) |
| *G11C 16/26* | (2006.01) |
| *G11C 29/36* | (2006.01) |
| *G11C 29/12* | (2006.01) |
| *G11C 29/18* | (2006.01) |
| *G11C 29/46* | (2006.01) |
| *G11C 16/32* | (2006.01) |

(52) U.S. Cl.
CPC .......... *G11C 29/38* (2013.01); *G11C 16/0483* (2013.01); *G11C 16/08* (2013.01); *G11C 16/10* (2013.01); *G11C 16/26* (2013.01); *G11C 16/32* (2013.01); *G11C 29/1201* (2013.01); *G11C 29/12015* (2013.01); *G11C 29/18* (2013.01); *G11C 29/36* (2013.01); *G11C 29/46* (2013.01); *G11C 2029/3602* (2013.01)

(58) Field of Classification Search
None
See application file for complete search history.

(56) References Cited

U.S. PATENT DOCUMENTS 5,818,772 A * 10/1998 Kuge .............. G11C 29/50012
365/201

FOREIGN PATENT DOCUMENTS

| KR | 1020090005918 A | 1/2009 |
|---|---|---|
| KR | 1020150063616 A | 6/2015 |

* cited by examiner

*Primary Examiner* — James G Norman
(74) *Attorney, Agent, or Firm* — William Park & Associates Ltd.

(57) ABSTRACT

The present disclosure relates to a memory device including a BIST circuit and an operating method thereof. The memory device includes a comparison circuit comparing test pattern data with sensing data to generate a comparison signal, a status information generating circuit generating a fail mask signal by marking data in which a failure occurs in the sensing data in response to the comparison signal, a column address generating circuit generating column addresses sequentially increasing in response to an input/output strobe signal, a latch enable signal generating circuit generating a latch enable signal in response to the fail mask signal, and an input/output circuit receiving the column addresses and selectively latching a column address in which a failure occurs among the column addresses in response to the latch enable signal.

20 Claims, 11 Drawing Sheets

MEMORY DEVICE AND OPERATING METHOD THEREOF

CROSS-REFERENCE TO RELATED APPLICATION

The present application claims priority under 35 U.S.C. § 119(a) to Korean patent application number 10-2018-0106926 filed on Sep. 7, 2018, in the Korean Intellectual Property Office, the entire disclosure of which is incorporated herein by reference.

BACKGROUND

1. Technical Field

Various embodiments relate generally to an electronic device, and more particularly, to a memory device and an operating method thereof.

2. Related Art

A memory device is a storage device formed using a semiconductor such as silicon (Si), germanium (Ge), gallium arsenide (GaAs), or indium phosphide (InP). Memory devices are generally classified into volatile memory devices and nonvolatile memory devices.

Volatile memory devices may lose stored data when powered off. Examples of the volatile memory devices may include a static random access memory (SRAM), a dynamic RAM (DRAM), a synchronous DRAM (SDRAM), and the like. Nonvolatile memory devices may retain stored data regardless of power on/off conditions. Examples of the nonvolatile memory devices may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. Flash memories may be generally classified into NOR-type memories and NAND-type memories.

With the development of semiconductor manufacturing technology, an integration degree of a memory device may be increased, and at the same time, the likelihood of failure may increase. Therefore, detecting defects in semiconductor manufacturing processes by analyzing errors occurring in a memory device becomes important.

For example, a test of a memory device has been carried out using external dedicated equipment. However, the emergence of system-on-chip (SoC) technology for integrating all components of a system into a single chip has brought significant changes in a test method of a memory device. For performance improvement, the SoC may use a plurality of internal memory devices having great data I/O widths. However, testing these internal memory devices using dedicated test equipment may be very inefficient due to a lack of the number of channels of the test equipment, limitations of a high-speed test and low access possibility to the internal memory devices.

A method of including a built-in self test (BIST) circuit in an SoC has been developed to avoid the above inefficiency. Research has been actively conducted on this method which is more advantageous in terms of a high-speed test than the existing method. As a result, this method has been widely used for an internal memory test for a system-on-chip (SoC).

SUMMARY

According to an embodiment, a memory device may include a comparison circuit comparing test pattern data with sensing data to generate a comparison signal, a status information generating circuit a fail mask signal by marking data in which a failure occurs in the sensing data in response to the comparison signal, a column address generating circuit generating column addresses sequentially increasing in response to an input/output strobe signal, a latch enable signal generating circuit generating a latch enable signal in response to the fail mask signal, and an input/output circuit receiving the column addresses and selectively latching a column address in which a failure occurs among the column addresses in response to the latch enable signal.

According to an embodiment, a memory device may include an internal circuit configured for programming a selected memory block with test pattern data and outputting sensing data by reading the selected memory block programmed with the test pattern data during a test operation, and a BIST circuit configured for generating the test pattern data, and generating a latch enable signal for latching column addresses increasing sequentially, and column addresses in which failures occur, during the test operation, wherein the internal circuit selectively latches only a column address in which a failure occurs, among the column addresses, to output a column address, in which a failure occurs, as a fail column address in response to the latch enable signal during the test operation.

According to an embodiment, an operating method of a memory device may include programming a selected memory block with pattern data during a self test operation, generating a logic signal including status information by comparing sensing data obtained by reading the selected memory block with the test pattern data, generating a fail mask signal by marking data in which a failure occurs in the sensing data, and generating a latch enable signal by using the fail mask signal, generating a plurality of column addresses sequentially increasing by using a count clock by delaying an input/output strobe signal by a predetermined time, and selectively outputting only a column address in which a failure occurs, among the plurality of column addresses, as a fail column address in response to the latch enable signal.

DETAILED DESCRIPTION

Figure 1:
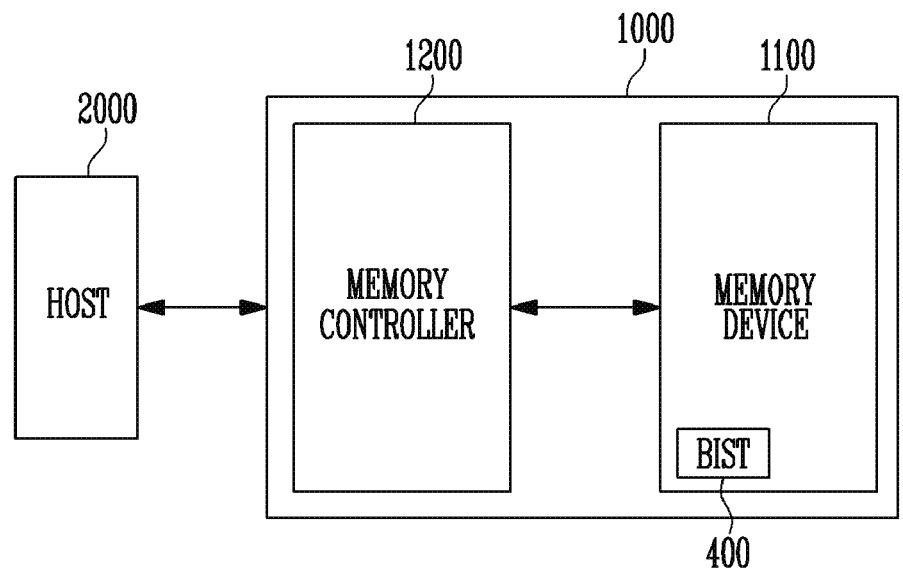
FIG. 1 is a diagram illustrating a memory system according to an embodiment of the present disclosure.

Hereinafter, specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

Various modifications and changes may be applied to the examples of embodiments in accordance with the concepts so that the examples of embodiments will be illustrated in the drawings and described in the specification. However, the embodiments according to the concept of the present disclosure are not construed as limited to specified disclosures, and include all changes, equivalents, or substitutes that do not depart from the spirit and technical scope of the present disclosure.

While terms such as "first" and "second" may be used to describe various components, such components must not be understood as being limited to the above terms. The above terminologies are used to distinguish one component from the other component, for example, a first component may be referred to as a second component without departing from a scope in accordance with the concept of the present disclosure and similarly, a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "~ between," "immediately ~ between" or "adjacent to ~" and "directly adjacent to ~" may be construed similarly.

The terms used in the present application are merely used to describe particular embodiments, and are not intended to limit the present disclosure. Singular forms in the present disclosure are intended to include the plural forms as well, unless the context clearly indicates otherwise. In the present specification, it should be understood that terms "include" or "have" indicate that a feature, a number, a step, an operation, a component, a part or the combination those of described in the specification is present, but do not exclude a possibility of presence or addition of one or more other features, numbers, steps, operations, components, parts or combinations thereof, in advance.

So far as not being differently defined, all terms used herein including technical or scientific terminologies have meanings that they are commonly understood by those skilled in the art to which the present disclosure pertains. The terms defined in generally used dictionaries should be construed as having the same meanings as would be construed in the context of the related art, and unless clearly defined otherwise in this specification, should not be construed as having idealistic or overly formal meanings.

In some embodiments, well-known processes, device structures, and technologies will not be described in detail to avoid ambiguousness of the present disclosure. This intends to disclose the gist of the present disclosure more clearly by omitting unnecessary description.

Hereinafter, examples of embodiments of the present disclosure will be described in detail with reference to the accompanying drawings in order for those skilled in the art to be able to readily implement the technical spirit of the present disclosure.

Various embodiments of the present disclosure may provide a memory device including a BIST circuit generating and outputting a fail column address and an operating method thereof.

FIG. 1 is a diagram illustrating a memory system 1000 according to an embodiment of the present disclosure.

Referring to FIG. 1, the memory system 1000 may include a memory device 1100 storing data and a memory controller 1200 controlling the memory device 1100 in response to control of a host 2000.

The host 2000 may communicate with the memory system 1000 using an interface protocol such as Peripheral Component Interconnect-Express (PCI-E), Advanced Technology Attachment (ATA), Serial ATA (SATA), Parallel ATA (PATA), or serial attached SCSI (SAS), etc. However, interface protocols provided for the purpose of data communication between the host 2000 and the memory system 1000 may not be limited to the above examples and may be one of different interface protocols such as a Universal Serial Bus (USB), a Multi-Media Card (MMC), an Enhanced Small Disk Interface (ESDI), and Integrated Drive Electronics (IDE), etc.

The memory controller 1200 may control the general operations of the memory system 1000 and control data exchange between the host 2000 and the memory device 1100. For example, the memory controller 1200 may control the memory device 1100 to program or read data in response to a request from the host 2000. In addition, the memory controller 1200 may store information about main memory blocks and sub-memory blocks included in the memory device 1100, and may select the memory device 1100 to perform a program operation on a main memory block or a sub-memory block according to the amount of data loaded for the program operation. According to an embodiment, the memory device 1100 may include Double Data Rate Synchronous Dynamic Random Access Memory (DDR SDRAM), Low Power Double Data Rate4 (LPDDR4) SDRAM, Graphics Double Data Rate (GDDR) SDRAM, Low Power DDR (LPDDR), Rambus Dynamic Random Access Memory (RDRAM), or FLASH Memory, etc.

The memory device 1100 may perform a program operation, a read operation, or an erase operation under the control of the memory controller 1200.

The memory device 1100 according to an embodiment of the present disclosure may perform a self test operation in response to control of the memory controller 1200. The self test operation may be performed by performing a test pattern write operation to program memory cells with test pattern data and comparing sensing data obtained by reading the programmed memory cells with the test pattern data. More particularly, in the self test operation, a column address of fail cells in which the test pattern data and the read sensing data have different data values, i.e., fail column address information may be generated and output.

Figure 2:
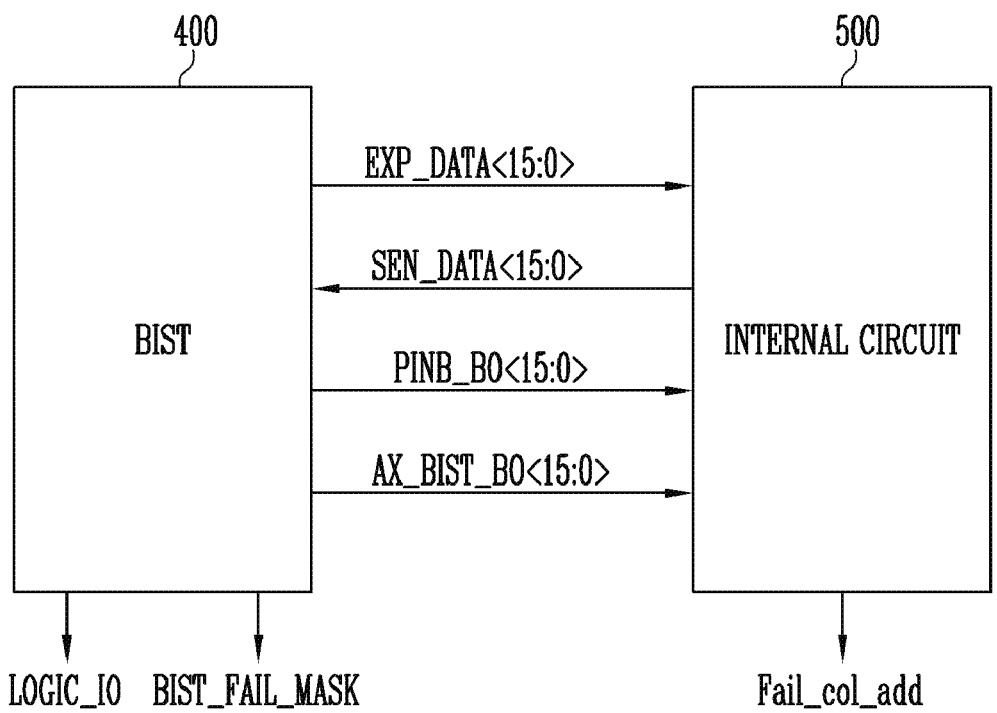
FIG. 2 is a diagram illustrating a memory device according to an embodiment of the present disclosure.

FIG. 2 is a diagram illustrating the memory device 1100 according to an embodiment of the present disclosure.

Referring to FIG. 2, the memory device 1100 may include a BIST circuit 400 and an internal circuit 500.

The BIST circuit 400 may generate and output test pattern data EXP_DATA<15:0> and may generate and output a logic signal LOGIC_IO and a fail mask signal BIST_FAIL_MASK indicating a test operation result by comparing sensing data SEN_DATA<15:0> read from the internal circuit 500 with the test pattern data EXP_DATA<15:0> during a test operation. In addition, during the test operation, the BIST circuit 400 may generate and output column address BIST signals AX_BIST_BO<15:0> including column addresses sequentially increasing, low byte fail information and high byte fail information, and may generate and output latch enable signals PINB_BO<15:0> in response to a column address in which a failure occurs. Column address BIST signals AX_BIST_BO<0, 15>, among the column address BIST signals AX_BIST_BO<15:0>, may refer to addresses for differentiating a low byte area from a high byte area. Column address BIST signals AX_BIST_BO<2:1> may be bank addresses. Column address BIST signals AX_BIST_BO<3:14> may be column addresses.

The memory controller 1200 of FIG. 1 may control the internal circuit 500 to perform a program, read, or erase operation during a normal operation. In addition, during the test operation, the internal circuit 500 may receive the test pattern data EXP_DATA<15:0> output from the BIST circuit 400, program memory cells of a selected memory block with the test pattern data EXP_DATA<15:0>, and output the sensing data SEN_DATA<15:0> to the BIST circuit 400 by performing a read operation on the programmed memory cells. In addition, during the test operation, the internal circuit 500 may selectively latch fail information on a column address where a failure occurs, among the column address BIST signals AX_BIST_BO<15:0> received from the BIST circuit 400, and the low and high byte fail information in response to the latch enable signals PINB_BO<15:0>, and may output a latched fail column address Fail_col_add to an external device (for example, the memory controller 1200 shown in FIG. 1).

In connection with an aforementioned embodiment, it is described that the logic signal LOGIC_IO and the fail mask signal BIST_FAIL_MASK indicating the test operation result generated by the BIST circuit 400 are output to the external device (e.g., the memory controller 1200 of FIG. 1). However, the present disclosure is not limited thereto. In other words, the logic signal LOGIC_IO and the fail mask signal BIST_FAIL_MASK may be output to the internal circuit 500.

Figure 3:
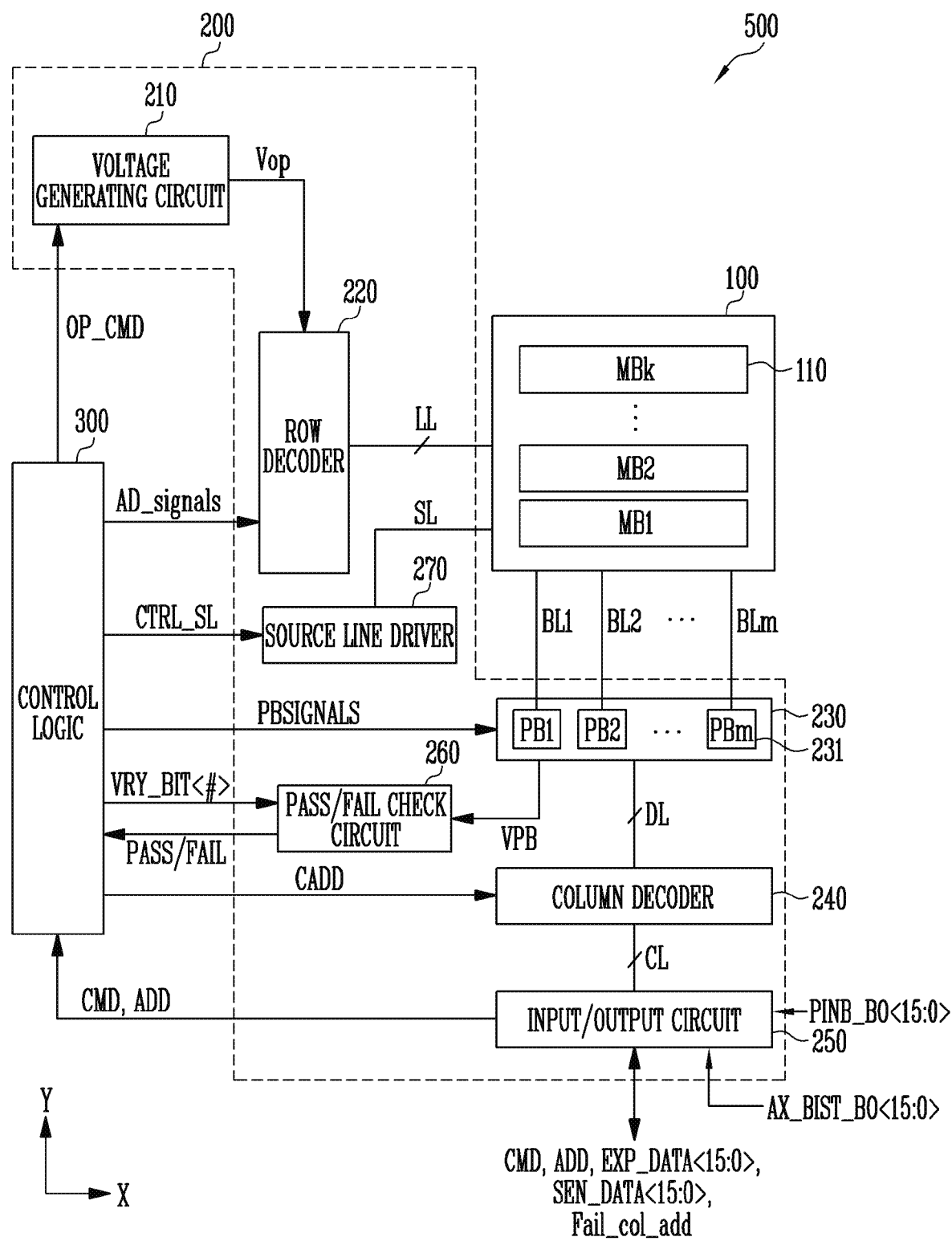
FIG. 3 is a diagram illustrating an internal circuit of a memory device according to an embodiment of the present disclosure.

FIG. 3 is a diagram illustrating the internal circuit 500 circuit shown in FIG. 2.

Referring to FIG. 3, the internal circuit 500 may include a memory cell array 100 storing data therein. The internal circuit 500 may include peripheral circuits 200 configured to perform a program operation to store data in the memory cell array 100, a read operation to output the stored data and, an erase operation to erase the stored data. The internal circuit 500 may include a control logic 300 for controlling the peripheral circuits 200 in response to control of the memory controller 1200 of FIG. 1. In addition, the internal circuit 500 may receive the test pattern data EXP_DATA<15:0> from the BIST circuit 400 of FIG. 2 during a test operation, program the selected memory block of the memory cell array 100 with the test pattern data EXP_DATA<15:0>, and read the data programmed into the selected memory block to output the sensing data SEN_DATA<15:0>. In addition, during the test operation, the internal circuit 500 may selectively latch only a column address in which a failure occurs, among the column address BIST signals AX_BIST_BO<15:0> received from the BIST circuit 400 of FIG. 2, in response to the latch enable signals PINB_BO<15:0>, and may output the latched fail column address Fail_col_add to an external device.

The memory cell array 100 may include a plurality of memory blocks (MB1 to MBk) 110, where k is a positive integer. Each of the memory blocks (MB1 to MBk) 110 may be coupled to local lines LL and bit lines BL1 to BLm, where m is a positive integer. For example, the local lines LL may include a first select line, a second select line, and a plurality of word lines arranged between the first and second select lines. In addition, the local lines LL may include dummy lines arranged between the first select line and the word lines and between the second select line and the word lines. The first select line may be a source select line and the second select line may be a drain select line. For example, the local lines LL may include word lines, drain and source select lines, and source lines SL. For example, the local lines LL may further include dummy lines. For example, the local lines LL may further include pipe lines. The local lines LL may be coupled to the memory blocks (MB1 to MBk) 110, respectively, and the bit lines BL1 to BLm may be commonly coupled to the memory blocks (MB1 to MBk) 110. The memory blocks (MB1 to MBk) 110 may have a two-dimensional or three-dimensional structure. For example, in the 2D memory blocks 110, memory cells may be arranged in parallel with a substrate. For example, in the 3D memory blocks 110, memory cells may be stacked in a vertical direction to the substrate.

The peripheral circuits 200 may be configured to perform program, read and erase operations on the selected memory block 110 in response to control of the control logic 300. For example, the peripheral circuits 200 may include a voltage generating circuit 210, a row decoder 220, a page buffer group 230, a column decoder 240, an input or output (input/output) circuit 250, a pass and fail (pass/fail) check circuit 260 and a source line driver 270.

The voltage generating circuit 210 may generate various operating voltages Vop applied to perform program, read and erase operations in response to an operation signal OP_CMD. In addition, the voltage generating circuit 210 may selectively discharge the local lines LL in response to the operation signal OP_CMD. For example, the voltage generating circuit 210 may generate a program voltage, a verify voltage and a pass voltage in response to control of the control logic 300.

The row decoder 220 may transfer the operating voltages Vop to the local lines LL coupled to the selected memory block 110 in response to row decoder control signals AD_signals. For example, the row decoder 220 may selectively apply operating voltages (e.g., a program voltage, a verify voltage and a pass voltage) generated by the voltage generating circuit 210 to word lines of the local lines LL in response to the row decoder control signals AD_signals.

The row decoder 220 may apply the program voltage generated by the voltage generating circuit 210 to a selected word line, among the local lines LL, and may apply the pass voltage generated by the voltage generating circuit 210 to unselected word lines in response to the row decoder control signals AD_signals during a program voltage applying operation. The row decoder 220 may apply the verify voltage generated by the voltage generating circuit 210 to a selected word line, among the local lines LL, and may apply the pass voltage generated by the voltage generating circuit 210 to unselected word lines in response to the row decoder control signals AD_signals during a read operation.

The page buffer group 230 may include a plurality of page buffers (PB1 to PBm) 231 coupled to bit lines BL1 to BLn. The page buffers (PB1 to PBm) 231 may operate in response to page buffer control signals PBSIGNALS. For example, the page buffers (PB1 to PBn) 231 may temporarily store data received through the bit lines BL1 to BLn, or may sense voltages or currents in the bit lines BL1 to BLm during a read or verify operation.

The column decoder 240 may transfer data between the input/output circuit 250 and the page buffer group 230 in response to a column address CADD. For example, the column decoder 240 may exchange data with the page buffers 231 through data lines DL, or with the input/output circuit 250 through column lines CL.

The input/output circuit 250 may transfer the command CMD and the address ADD from the memory controller 1200 shown in FIG. 1 to the control logic 300, or may exchange data DATA with the column decoder 240.

In addition, during the test operation, the input/output circuit 250 may selectively latch only a column address in which a failure occurs, among the column address BIST signals AX_BIST_BO<15:0> received from the BIST circuit 400 of FIG. 2, in response to the latch enable signals PINB_BO<15:0>, and may output the latched fail column address Fail_col_add to an external device The pass/fail check circuit 260 may generate a reference current in response to an allowable bit VRY_BIT<#> and compare a sensing voltage VPB received from the page buffer group 230 with a reference voltage generated by the reference current to output a pass signal PASS or a fail signal FAIL during a read operation or a verify operation.

The source line driver 270 may be coupled to the memory cells included in the memory cell array 100 through the source line SL and may control a voltage applied to the source line SL. The source line driver 270 may receive a source line control signal CTRL_SL from the control logic 300 and control a source line voltage applied to the source line SL on the basis of the source line control signal CTRL_SL.

The control logic 300 may control the peripheral circuits 200 by outputting the operation signal OP_CMD, the row decoder control signals AD_signals, the page buffer control signals PBSIGNALS and the allowable bit VRY_BIT<#> in response to the command CMD and the address ADD. In addition, the control logic 300 may determine whether the verify operation passes or fails in response to the pass or fail signal PASS or FAIL.

Figure 4:
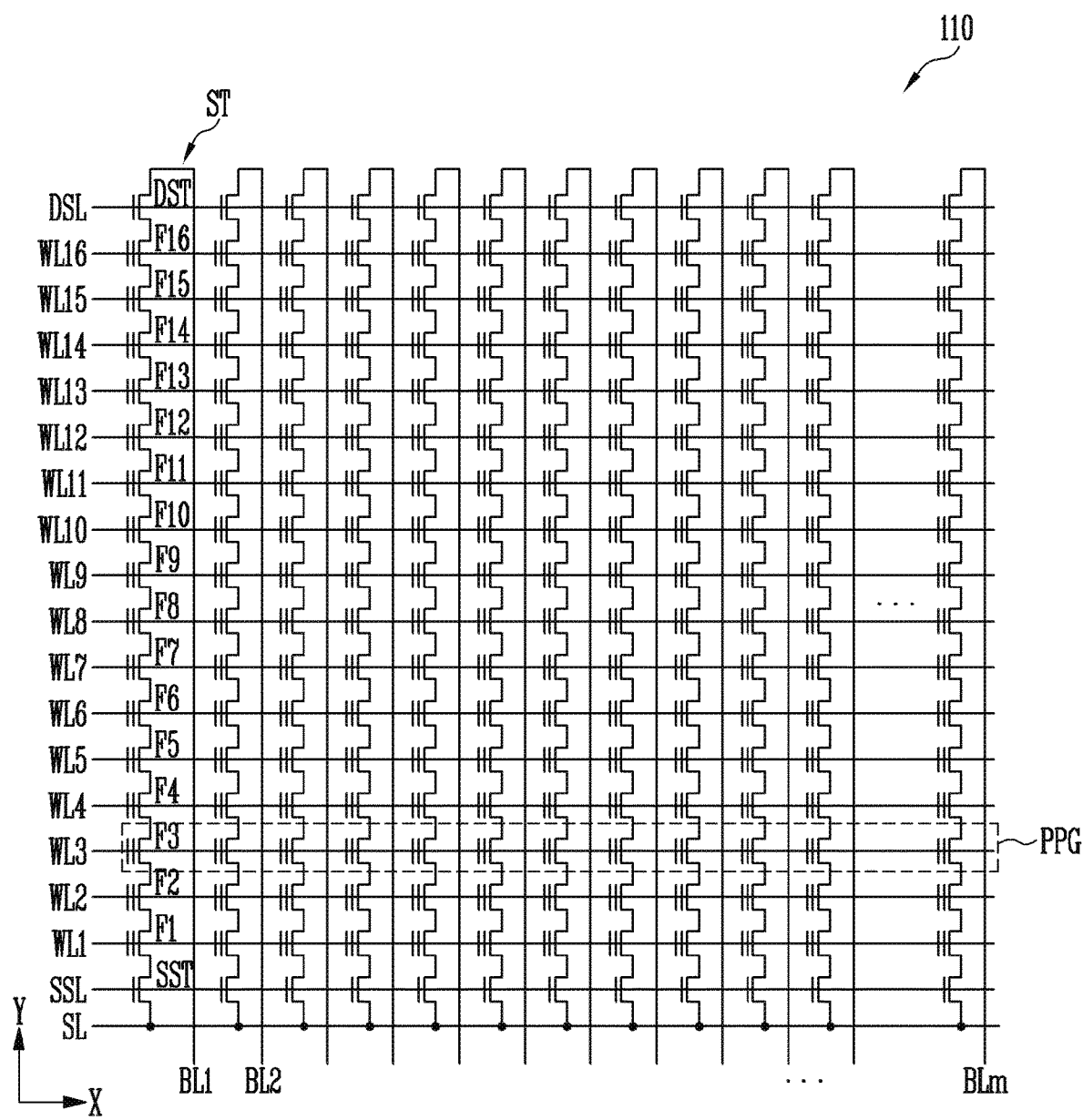
FIG. 4 is a diagram illustrating a memory block shown in FIG. 3.

FIG. 4 is a diagram illustrating the memory block 110 shown in FIG. 3.

Referring to FIG. 4, the memory block 110 may be coupled to the plurality of word lines arranged in parallel with the first select line and the second select line. The first select line may be a source select line SSL and the second select line may be a drain select line DSL. For example, the memory block 110 may include a plurality of strings ST coupled between the bit lines BL1 to BLm and the source line SL. The bit lines BL1 to BLm may be coupled to the strings ST, respectively, and the source line SL may be coupled in common to the strings ST. Since the strings ST may have the same configuration, the string ST coupled to the first bit line BL1 will be described below as an example.

The string ST may include at least one source select transistor SST and at least one drain select transistor DST, and may include a plurality of memory cells F1 to F16 which are coupled in series between the source line SL and the first bit line BL1. A single string ST may include at least one source select transistor SST, at least one drain select transistor DST, and more memory cells than the memory cells F1 to F16 as shown in FIG. 4.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to a source select line SSL, gates of the drain select transistors DST may be coupled to a drain select line DSL, and gates of the memory cells F1 to F16 may be coupled to a plurality of word lines WL1 to WL16. A group of memory cells coupled to the same word line, among memory cells included in different strings ST, may be referred to as a physical page PPG. Therefore, the memory block 110 may include as many physical pages PPG as the number of word lines WL1 to WL16.

A single memory cell may store one bit of data. This memory cell is generally called a single level cell (SLC). A single physical page PPG may store data corresponding to a single logical page LPG. Data corresponding to a single logical page LPG may include as many data bits as the number of cells included in the single physical page PPG. In addition, a single memory cell may store two or more bits of data. This cell is typically referred to as a "multi-level cell (MLC)". The single physical page PPG may store data corresponding to two or more logical pages (LPG).

Memory cells included in different strings may correspond to different column addresses. In addition, memory cells included in one string may correspond to one column address. In other words, one string may be defined as one column, and one string may correspond to one column address.

Figure 5:
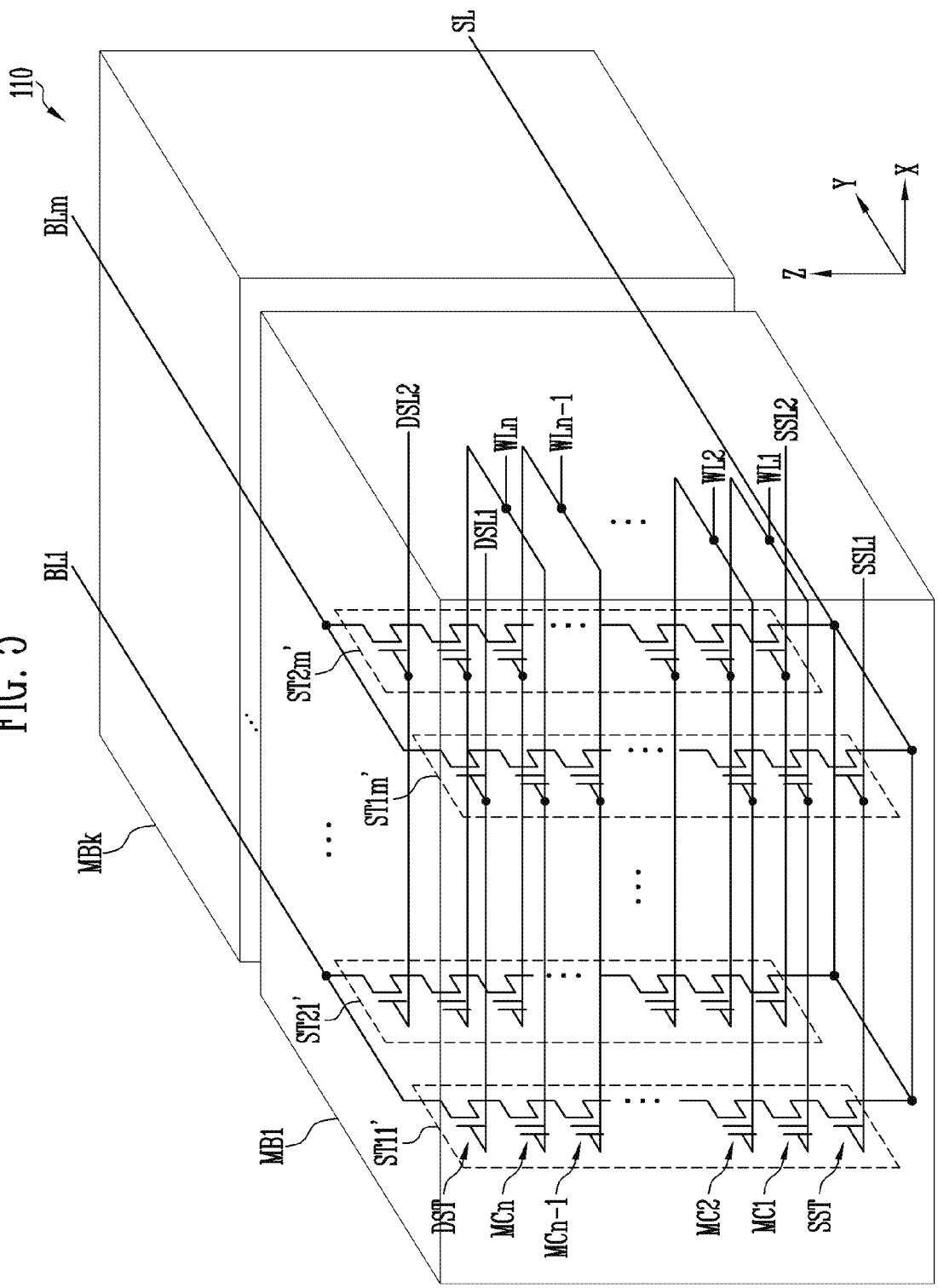
FIG. 5 is a diagram illustrating an embodiment of a three-dimensionally structured memory block.

Referring to FIG. 5, the memory cell array 100 may include the plurality of memory blocks (MB1 to MBk) 110. The memory block 110 may include a plurality of strings ST11' to ST1*m*' and ST21' to ST2*m*'. Each of the plurality of strings ST11' to ST1*m*' and ST21' to ST2*m*' may extend in a vertical direction (Z direction). In the memory block 110, 'm' strings may be arranged in a row direction (X direction). Although FIG. 5 illustrates two strings arranged in a column direction (e.g., Y direction) for convenience of description, three or more strings may be arranged in the column direction (e.g., Y direction) in other embodiments.

Each of the plurality of strings ST11' to ST1*m*' and ST21' to ST2*m*' may include at least one source select transistor SST, first to nth memory cells MC1 to MCn, and at least one drain select transistor DST.

The source select transistor SST of each string may be coupled between the source line SL and the memory cells MC1 to MCn. Source select transistors of strings arranged in the same row may be coupled to the same source select line. The source select transistors of the strings ST11' to ST1*m*' arranged in a first row may be coupled to a first source select line SSL1. The source select transistors of the strings ST21' to ST2*m*' arranged in a second row may be coupled to a second source select line SSL2. According to an embodiment, the source selection transistors of the strings ST11' to ST1m' and ST21' to ST2m' may be commonly coupled to a single source select line.

The first to nth memory cells MC1 to MCn of each string may be coupled in series between the source select transistor SST and the drain select transistor DST. Gates of the first to nth memory cells MC1 to MCn may be coupled to first to nth word lines WL1 to WLn, respectively.

According to an embodiment, at least one of the first to nth memory cells MC1 to MCn may serve as a dummy memory cell. When the dummy memory cell is provided, a voltage or current of the corresponding string may be stably controlled. As a result, the reliability of data stored in the memory block 110 may be improved.

The drain select transistor DST of each string may be coupled between the corresponding bit line and the memory cells MC1 to MCn. The drain select transistors DST of strings arranged in the row direction may be coupled to a drain select line extending in the row direction. The drain select transistors DST of strings CS11' to CS1m' in the first row may be coupled to a first drain select line DSL1. The drain select transistors DST of strings CS21' to CS2m' in the second row may be coupled to a second drain select line DSL2.

Figure 6:
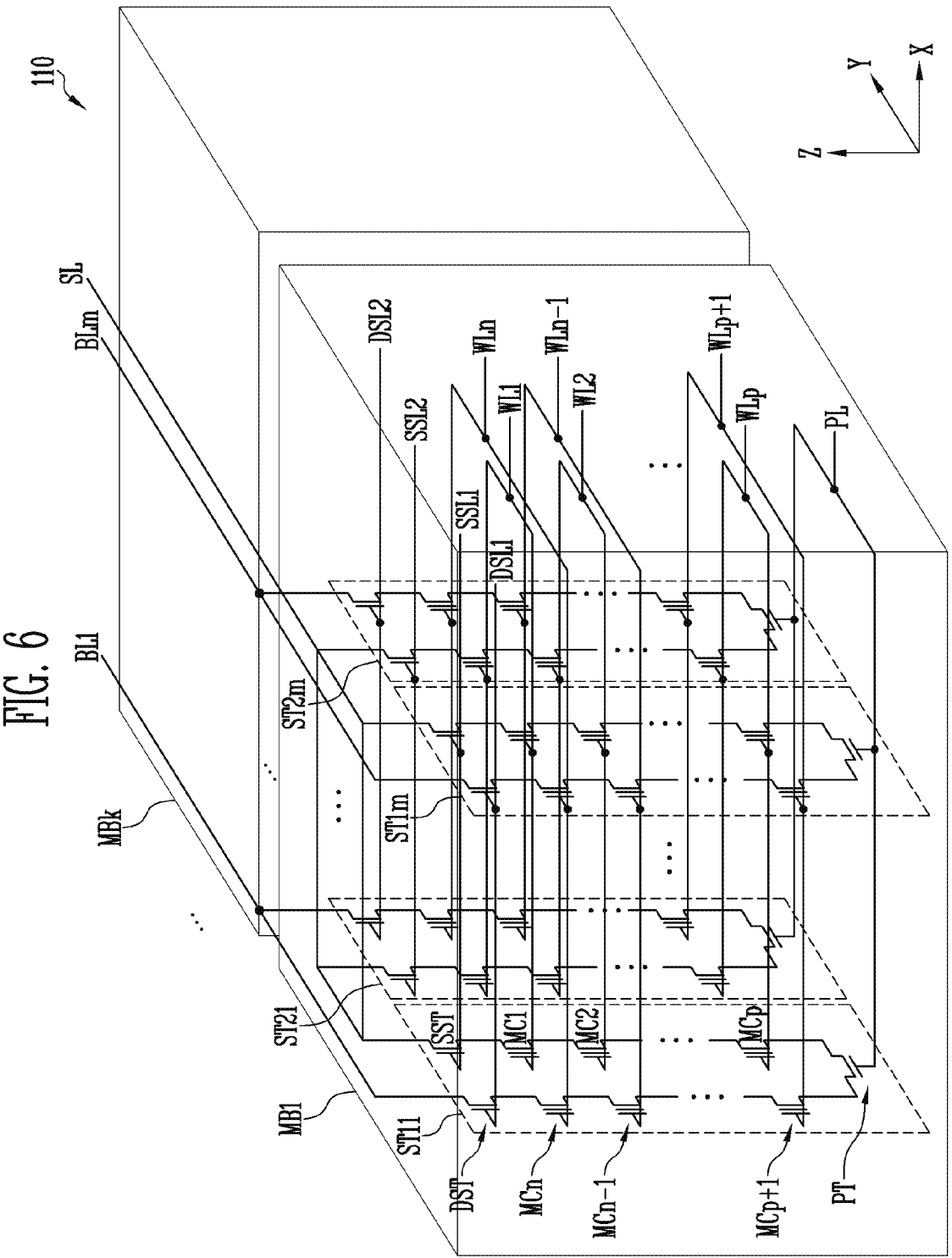
FIG. 6 is a diagram illustrating an embodiment of a three-dimensionally structured memory block.

FIG. 6 is a diagram illustrating an embodiment of a three-dimensionally structured memory block.

Referring to FIG. 6, the memory cell array 100 may include the plurality of memory blocks (MB1 to MBk) 110. The memory block 110 may include a plurality of strings ST11 to ST1m and ST21 to ST2m. According to an embodiment, each of the plurality of strings ST11 to ST1m and ST21 to ST2m may have a 'U' shape. In the first memory block MB1, 'm' strings may be arranged in a row direction (X direction). For convenience of explanation, FIG. 5 illustrates two strings arranged in a column direction (Y direction). However, three or more strings may be arranged in the column direction (Y direction).

Each of the plurality of strings ST11 to ST1m and ST21 to ST2m may include at least one source selection transistor SST, first to nth memory cells MC1 to MCn, a pipe transistor PT and at least one drain select transistor DST.

The source and drain select transistors SST and DST and the memory cells MC1 to MCn may have similar structures to each other. For example, each of the source and drain select transistors SST and DST and the memory cells MC1 to MCn may include a channel layer, a tunnel insulating layer, a charge trap layer, and a blocking insulating layer. For example, a pillar for providing a channel layer may be provided in each string. For example, a pillar for providing at least one of the channel layer, the tunnel insulating layer, the charge trap layer and the blocking insulating layer may be provided in each string.

The source select transistor SST of each string may be coupled between the source line SL and the memory cells MC1 to MCn.

In an embodiment, source select transistors of strings arranged in the same row may be coupled to a source select line extending in the row direction, and source select transistors of strings arranged in different rows may be coupled to different source select lines. As shown in FIG. 5, the source select transistors of the strings ST11 to ST1m in the first row may be coupled to the first source select line SSL1. The source select transistors of the strings ST21 to ST2m arranged in the second row may be coupled to the second source select line SSL2.

According to an embodiment, the source select transistors of the strings ST11 to ST1m and ST21 to ST2m may be commonly coupled to one source select line.

The first to nth memory cells MC1 to MCn of each string may be coupled between the source select transistor SST and the drain select transistor DST.

The first to nth memory cells MC1 to MCn may be divided into first to pth memory cells MC1 to MCp and (p+1)th to nth memory cells MCp+1 to MCn. The first to pth memory cells MC1 to MCp may be sequentially arranged in a vertical direction (Z direction) and be coupled in series between the source select transistor SST and the pipe transistor PT. The (p+1)th to nth memory cells MCp+1 to MCn may be sequentially arranged in the vertical direction (Z direction) and be coupled in series between the pipe transistor PT and the drain select transistor DST. The first to pth memory cells MC1 to MCp and the (p+1)th to nth memory cells MCp+1 to MCn may be coupled to each other through the pipe transistor PT. Gates of the first to nth memory cells MC1 to MCn of each string may be coupled to the first to nth word lines WL1 to WLn, respectively.

According to an embodiment, at least one of the first to nth memory cells MC1 to MCn may serve as a dummy memory cell. When the dummy memory cell is provided, a voltage or current of the corresponding string may be stably controlled. A gate of the pipe transistor PT of each string may be coupled to a pipeline PL.

The drain select transistor DST of each string may be coupled between the corresponding bit line and the memory cells MCp+1 to MCn. Strings arranged in the row direction may be coupled to a drain select line extending in the row direction. Drain select transistors of the strings ST11 to ST1m in the first row may be coupled to the first drain select line DSL1. Drain select transistors of the strings ST21 to ST2m in the second row may be coupled to the second drain select line DSL2.

Strings arranged in a column direction may be coupled to bit lines extending in the column direction. As shown in FIG. 6, the strings ST11 and ST21 in the first column may be coupled to the first bit line BL1. The strings ST1m and ST2m in the mth column may be coupled to the mth bit line BLm.

Memory cells coupled to the same word line, among strings arranged in the row direction, may form a single page. For example, memory cells coupled to the first word line WL1, among the strings ST11 to ST1m in the first row, may constitute one page. Among the strings ST21 to ST2m in the second row, memory cells coupled to the first word line WL1 may constitute another page. When one of the drain select lines DSL1 and DSL2 is selected, strings arranged in one row direction may be selected. One page may be selected from the selected strings by selecting any one of the word lines WL1 to WLn.

In other words, the memory block 110 as shown in FIG. 6 may have a similar equivalent circuit to the memory block 110 as shown in FIG. 5 except that the pipe transistor PT is included in each string.

Figure 7:
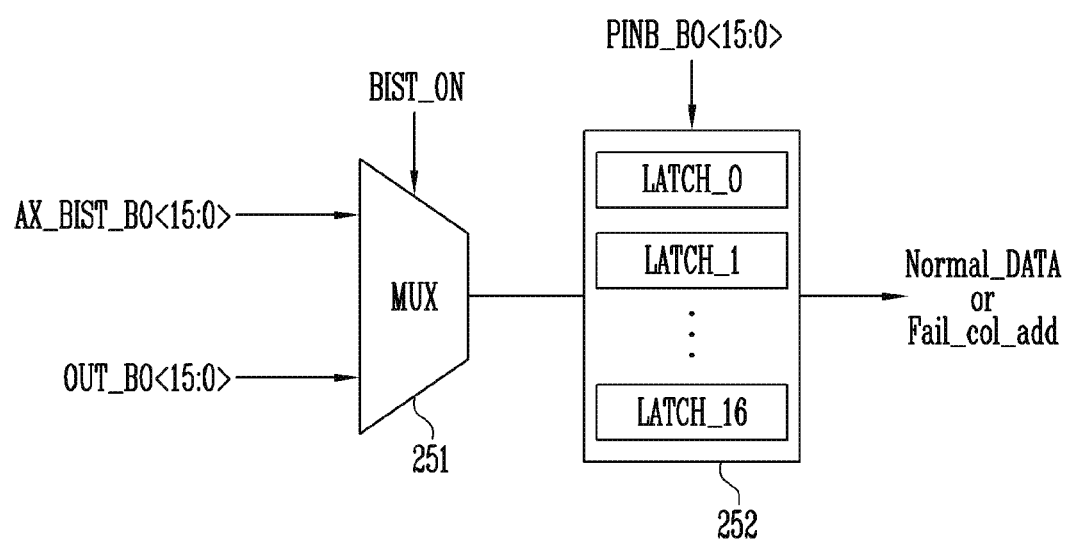
FIG. 7 is a diagram illustrating an input/output circuit shown in FIG. 3.

FIG. 7 is a diagram illustrating the input/output circuit 250 shown in FIG. 3.

Referring to FIG. 7, during a normal operation, the input/output circuit 250 may receive and latch output data OUT_BO<15:0> received through the column lines CL and may output the latched data as normal data Normal_DATA. In addition, during a test operation, the input/output circuit 250 may selectively latch only a column address in which a failure occurs, among the column address BIST signals AX_BIST_BO<15:0> received from the BIST circuit 400 of FIG. 2, in response to the latch enable signals PIN- B_BO<15:0>, and may output the latched fail column address Fail_col_add to outside.

The input/output circuit 250 may include a selection circuit 251 and a latch circuit 252.

The selection circuit 251 may receive the output data OUT_BO<15:0> during the normal operation, and may receive and output the column address BIST signals AX_BIST_BO<15:0> during the test operation. The selection circuit 251 may include, for example but not limited to, a multiplexer MUX. The multiplexer MUX may selectively output the output data OUT_BO<15:0> and the column address BIST signals AX_BIST_BO<15:0> in response to a BIST enable signal BIST_ON.

The latch circuit 252 may output the normal data Normal_DATA by latching the output data OUT_BO<15:0> output from the selection circuit 251 during a normal operation, and may selectively latch only a column address in which a failure occurs, among the column address BIST signals AX_BIST_BO<15:0> output from the selection circuit 251, in response to the latch enable signals PINB_BO<15:0> to output the latched fail column address Fail_col_add during a test operation. The latch circuit 252 may include a plurality of latches LATCH_0 to LATCH_16. The plurality of latches LATCH_0 to LATCH_16 may output the normal data Normal_DATA by latching the output data OUT_BO<15:0> output from the selection circuit 251. Each of the plurality of latches LATCH_0 to LATCH_16 may latch a column address in which a failure occurs in response to each of the latch enable signals PINB_BO<15:0> for activating only a bit signal corresponding to the column address in which the failure occurs, among the column address BIS signals AX_BIST_BO<15:0> output from the selection circuit 251, to output the latched column address as the fail column address Fail_col_add during the test operation.

Figure 8:
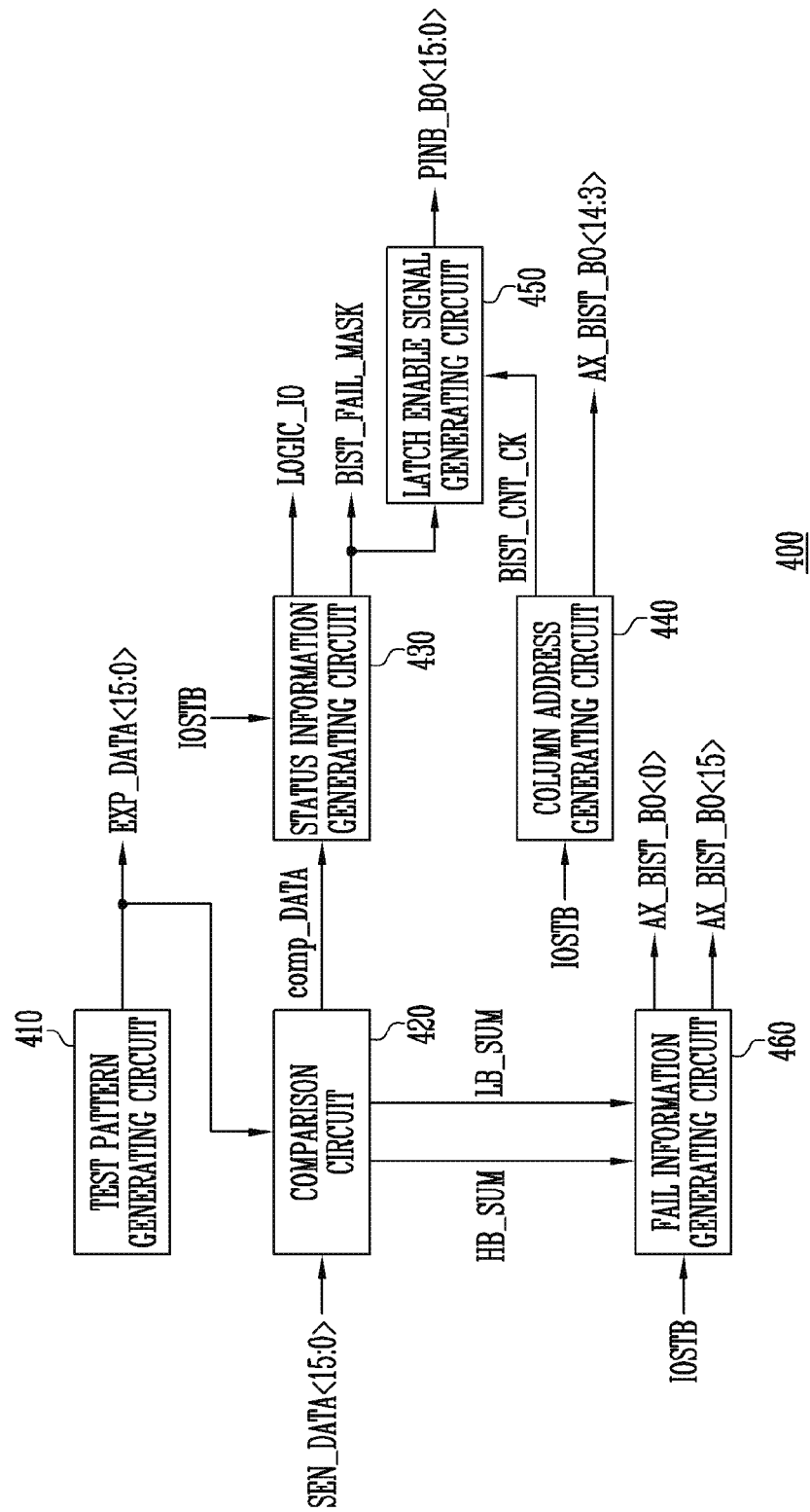
FIG. 8 is a diagram illustrating a BIST circuit shown in FIG. 2.

FIG. 8 is a diagram illustrating the BIST circuit 400 shown in FIG. 2.

Referring to FIG. 8, the BIST circuit 400 may include a test pattern generating circuit 410, a comparison circuit 420, a status information generating circuit 430, a column address generating circuit 440, a latch enable signal generating circuit 450, and a fail information generating circuit 460.

The test pattern generating circuit 410 may generate the test pattern data EXP_DATA<15:0> to be programmed into a selected memory block (e.g., MB1) of the memory cell array 100 during a test operation. The test pattern generating circuit 410 may generate the test pattern data EXP_DATA<15:0> with random values or sequentially increasing values. In an embodiment of the present disclosure, it is exemplified that the test pattern data EXP_DATA<15:0> have sixteen bit values. However, the present disclosure is not limited thereto. A unit amount of test pattern data generated in units of a column address may be controlled. For example, according to an embodiment of the present disclosure, when column addresses are divided into eight column addresses, the test pattern data EXP_DATA<15:0> corresponding to a total of sixteen column addresses consisting of eight column addresses included in a low byte area and eight column addresses in a high byte area is described below as an example. In addition, the test pattern data EXP_DATA<15:0> may correspond to different column addresses.

The comparison circuit 420 may generate and output comparison signals comp_DATA by comparing the test pattern data EXP_DATA<15:0> generated by the test pattern generating circuit 410 with the sensing data SEN_DATA<15:0> read by the internal circuit 500. For example, the comparison circuit 420 may sequentially compare the test pattern data EXP_DATA<15:0> with the sensing data SEN_DATA<15:0> and may generate and output the comparison signals comp_DATA corresponding to comparison result values that are sequentially output. For example, the comparison circuit 420 may generate the comparison signal comp_DATA having a first logic level (e.g., a logic low level) when the test pattern data EXP_DATA<0> and the sensing data SEN_DATA<0> are the same as each other, and may generate the comparison signal comp_DATA having a second logic level (e.g., a logic high level) by determining a test result failure when the test pattern data EXP_DATA<1> and the sensing data SEN_DATA<1> are different from each other. In other words, the comparison circuit 420 may compare data values of the test pattern data EXP_DATA<15:0> with data values of the sensing data SEN_DATA<15:0> and may generate and output the comparison signal comp_DATA having a logic level which transitions to a logic low level or a logic high level. The sensing data SEN_DATA<15:0> may be obtained by reading memory cells programmed with the test pattern data EXP_DATA<15:0> generated by the test pattern generating circuit 410 during a test pattern write operation. The sensing data EXP_DATA<15:0> may correspond to different column addresses.

In addition, the comparison circuit 420 may compare low byte data EXP_DATA<7:0> of the test pattern data EXP_DATA<15:0> with low byte data SEN_DATA<7:0> of the sensing data SEN_DATA<15:0> to generate and output low byte fail information LB_SUM indicating whether a test result failure occurs in the low byte area. In addition, the comparison circuit 420 may compare high byte data EXP_DATA<15:8> of the test pattern data EXP_DATA<15:0> with high byte data SEN_DATA<15:8> of the sensing data SEN_DATA<15:0> to generate and output high byte fail information HB_SUM indicating whether a test result failure occurs in the high byte area.

The status information generating circuit 430 may generate and output the logic signal LOGIC_IO indicating whether the test result failure occurs in response to the comparison signal comp_DATA output by the comparison circuit 420. The status information generating circuit 430 may generate the logic signal LOGIC_IO according to the comparison signal comp_DATA in response to an input/output strobe signal IOSTB which is periodically toggled, and may generate and output the logic signal LOGIC_IO fixed to a status fail value when the comparison signal comp_DATA has a logic level value corresponding to the test result failure. The input/output strobe signal IOSTB may be for strobing data during a data input/output operation by the page buffer group 230 of the internal circuit 500. In addition, the status information generating circuit 430 may generate and output the fail mask signal BIST_FAIL_MASK in response to the input/output strobe signal IOSTB and the comparison signal comp_DATA. The fail mask signal BIST_FAIL_MASK may be generated by synchronizing the comparison signal comp_DATA with the input/output strobe signal IOSTB. The fail mask signal BIST_FAIL_MASK may be obtained by marking data in which a failure occurs in the sensing data SEN_DATA<15:0>.

The column address generating circuit 440 may generate and output column address BIST signals AX_BIST_BO<14:3> which sequentially increase in response to the input/output strobe signal IOSTB. In addition, the column address generating circuit 440 may generate and output a BIST count clock BIST_CNT_CK in response to the input/output strobe signal IOSTB.

The latch enable signal generating circuit 450 may generate and output the latch enable signals PINB_BO<15:0> in response to the fail mask signal BIST_FAIL_MASK and the BIST count clock BIST_CNT_CK so that the input/output circuit 250 of FIG. 3 may latch the column address BIST signals AX_BIST_BO<15:0> corresponding to columns in which failures occur.

The fail information generating circuit 460 may generate and output the column address BIST signals AX_BIST_BO<0> and AX_BIST_BO<15> in response to the input/output strobe signal IOSTB, the high byte fail information HB_SUM and the low byte fail information LB_SUM.

Figure 9:
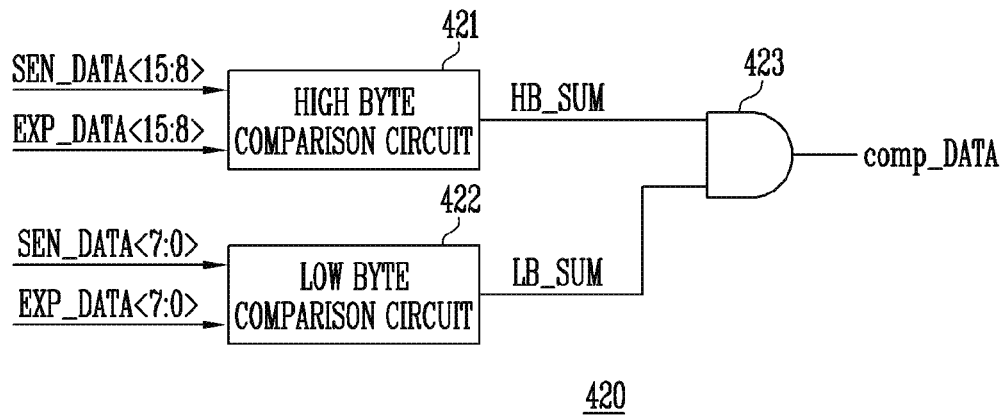
FIG. 9 is a diagram illustrating a comparison circuit shown in FIG. 8.

FIG. 9 is a diagram illustrating the comparison circuit 420 shown in FIG. 8.

Referring to FIG. 9, the comparison circuit 420 may include a high byte comparison circuit 421, a low byte comparison circuit 422 and a logic gate 423.

In addition, the high byte comparison circuit 421 may compare the high byte data EXP_DATA<15:8> of the test pattern data EXP_DATA<15:0> with the high byte data SEN_DATA<15:8> of the sensing data SEN_DATA<15:0> to generate and output the high byte fail information HB_SUM indicating whether a test result failure occurs in the high byte area.

The low byte comparison circuit 422 may compare the low byte data EXP_DATA<7:0> of the test pattern data EXP_DATA<15:0> with the low byte data SEN_DATA<7:0> of the sensing data SEN_DATA<15:0> to generate and output the low byte fail information LB_SUM indicating whether a test result failure occurs in the low byte area.

The logic gate 423 may perform a logic combination on the high byte fail information HB_SUM and the low byte fail information LB_SUM.

Figure 10:
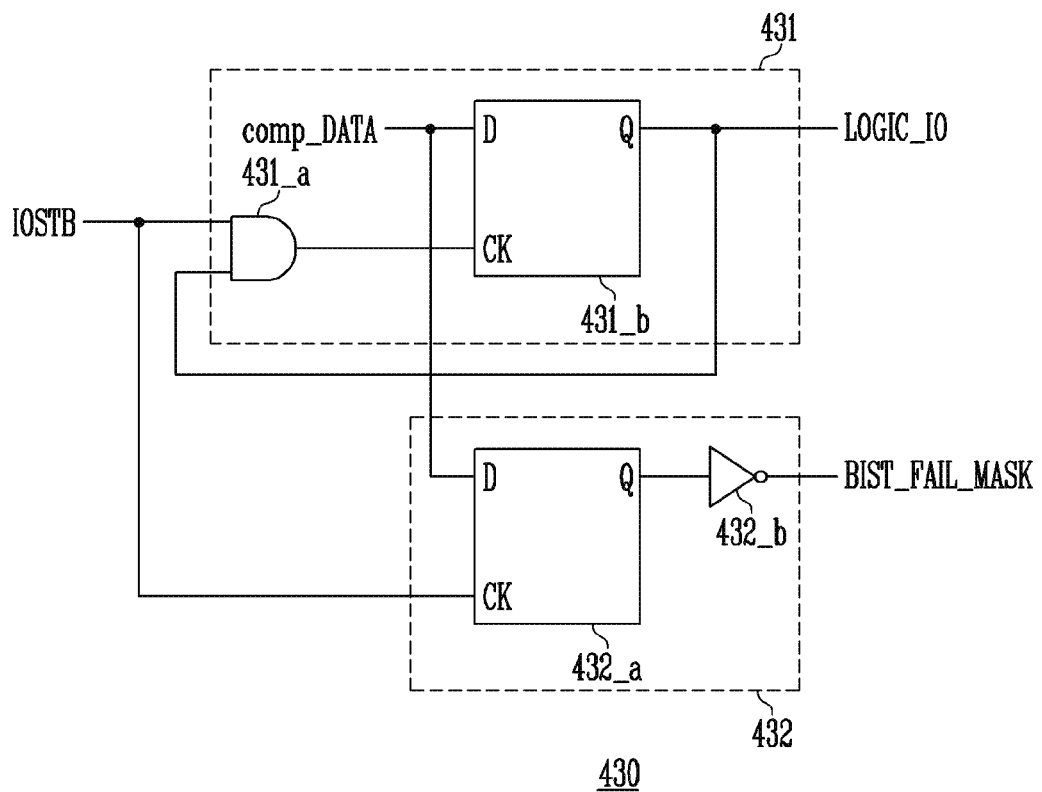
FIG. 10 is a diagram illustrating a status information generating circuit shown in FIG. 8.

FIG. 10 is a diagram illustrating the status information generating circuit 430 shown in FIG. 8.

Referring to FIG. 10, the status information generating circuit 430 may include a logic signal generating circuit 431 and a fail mask signal generating circuit 432.

The logic signal generating circuit 431 may generate and output the logic signal LOGIC_IO indicating whether a test result failure occurs in response to the comparison signal comp_DATA output by the comparison circuit 420.

The logic signal generating circuit 431 may include, for example but not limited to, a logic gate 431_a and a flip-flop 431_b. The logic gate 431_a may generate and output a logic combination signal in response to the input/output strobe signal IOSTB and the logic signal LOGIC_IO corresponding to an output signal of the flip-flop 431_b. The logic gate 431_a may include, for example but not limited to, an AND gate. The flip-flop 431_b may synchronize the comparison signal comp_DATA with the logic combination signal output from the logic gate 431_a to output the logic signal LOGIC_IO. The logic gate 431_a may receive the logic signal LOGIC_IO as a feedback to generate the logic combination signal. Therefore, when the logic signal LOGIC_IO is output at a logic low level, a logic combination signal of a logic low level may be output even when the input/output strobe signal IOSTB is toggled. Therefore, the flip-flop 431_b may output the logic level LOGIC_IO fixed to the logic low level regardless of the low level of the comparison signal comp_DATA. In other words, the logic signal generating circuit 431 may generate and output the logic signal LOGIC_IO fixed to the logic low level regardless of the logic level of the comparison signal comp_DATA which is subsequently input when the logic signal LOGIC_IO of the logic low level indicating a test result failure is generated in response to the comparison signal comp_DATA.

The fail mask signal generating circuit 432 may include, for example but not limited to, a flip-flop 432_a and an inverter 432_b. The flip-flop 432_a may generate an output signal by synchronizing the comparison signal comp_DATA with the input/output strobe signal IOSTB and may output the fail mask signal BIST_FAIL_MASK by inverting an output signal of the flip-flop 432_a.

Figure 11:
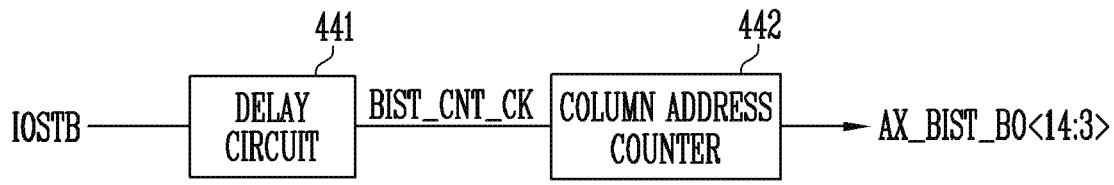
FIG. 11 is a diagram illustrating a column address generating circuit shown in FIG. 8.

FIG. 11 is a diagram illustrating the column address generating circuit 440 shown in FIG. 8.

Referring to FIG. 11, the column address generating circuit 440 may include a delay circuit 441 and a column address counter 442.

The delay circuit 441 may delay the input/output strobe signal IOSTB by a predetermined time to output the BIST count clock BIST_CNT_CK. The predetermined time may be set by considering a read time of the sensing data SEN_DATA<15:0> and a comparison operation time of the sensing data SEN_DATA<15:0> and the test pattern data EXP_DATA<15:0>. The word "predetermined" as used herein with respect to a parameter, such as a predetermined time, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The column address counter 442 may generate and output the column address BIST signals AX_BIST_BO<14:3> which sequentially increase by counting the BIST count clock BIST_CNT_CK.

Figure 12:
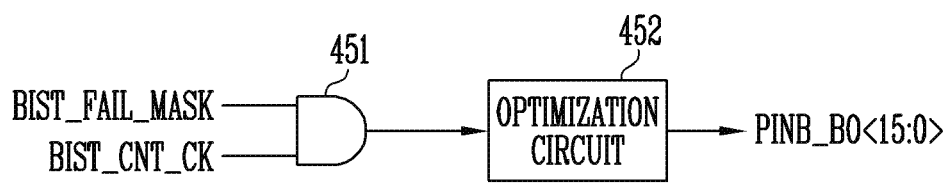
FIG. 12 is a diagram illustrating a latch enable signal generating circuit shown in FIG. 8.

FIG. 12 is a diagram illustrating the latch enable signal generating circuit 450 shown in FIG. 8.

Referring to FIG. 12, the latch enable signal generating circuit 450 may include a logic gate 451 and an optimization circuit 452.

The logic gate 451 may generate and output a logic combination signal in response to the fail mask signal BIST_FAIL_MASK and the BIST count clock BIST_CNT_CK. In other words, the logic gate 451 may divide and output the fail mask signal BIST_FAIL_MASK into a plurality of bits according to the BIST count clock BIST_CNT_CK.

The optimization circuit 452 may output the fail mask signal BIST_FAIL_MASK divided into the plurality of bits output by the logic gate 451 as the latch enable signals PINB_BO<15:0>. The optimization circuit 452 may output the latch enable signals PINB_BO<15:0> by controlling the delay and the pulse width of the fail mask signal BIST_FAIL_MASK.

Figure 13:
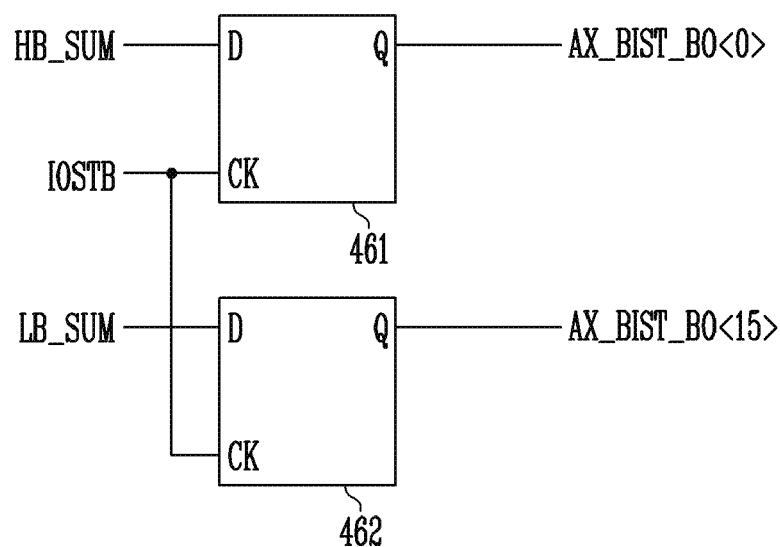
FIG. 13 is a diagram illustrating a fail information generating circuit shown in FIG. 8.

FIG. 13 is a diagram illustrating the fail information generating circuit 460 shown in FIG. 8.

Referring to FIG. 13, the fail information generating circuit 460 may include a high byte fail information generation unit 461 generating the column address BIST signal AX_BIST_BO<0> in response to the input/output strobe signal IOSTB and the high byte fail information HB_SUM and a low byte fail information generation unit 462 generating the column address BIST signal AX_BIST_BO<15> in response to the input/output strobe signal IOSTB and the low byte fail information LB_SUM.

Each of the high byte fail information generation unit 461 and the low byte fail information generation unit 462 may include a flip-flop.

A test operation of a memory device according to an embodiment of the present disclosure is described below with reference to FIGS. 1 to 13.

The memory device 1100 according to an embodiment of the present disclosure may perform a self test operation in response to control of the memory controller 1200. The test pattern generating circuit 400 of the BIST circuit 400 may generate the test pattern data EXP_DATA<15:0> to be programmed into a selected memory block (e.g., MB1) of the memory cell array 100 during a self test operation.

The internal circuit 500 may receive the test pattern data EXP_DATA<15:0> from the BIST circuit 400 and perform a test pattern write operation by programming the received test pattern data EXP_DATA<15:0> into a memory block (e.g., MB1).

Subsequently, the internal circuit 500 may output the sensing data SEN_DATA<15:0> to the BIST circuit 400 by reading data stored in the memory block (e.g., MB1).

The comparison circuit 420 of the BIST circuit 400 may generate and output the comparison signals comp_DATA by comparing the test pattern data EXP_DATA<15:0> generated by the test pattern generating circuit 410 with the sensing data SEN_DATA<15:0> read by the internal circuit 500.

The status information generating circuit 430 may generate and output the logic signal LOGIC_IO indicating whether a test result failure occurs in response to the comparison signal comp_DATA output by the comparison circuit 420. When the comparison signal comp_DATA has a logic level value corresponding to at least the test result failure, the status information generating circuit 430 may generate and output the logic signal LOGIC_IO fixed to a status fail value. The status information generating circuit 430 may generate and output the fail mask signal BIST_FAIL_MASK in response to the input/output strobe signal IOSTB and the comparison signal comp_DATA.

The column address generating circuit 440 may generate and output the column address BIST signals AX_BIST_BO<14:3> which sequentially increase in response to the input/output strobe signal IOSTB. In addition, the column address generating circuit 440 may generate and output the BIST count clock BIST_CNT_CK in response to the input/output strobe signal IOSTB. The column address generating circuit 440 may generate the BIST count clock BIST_CNT_CK by delaying the input/output strobe signal IOSTB by a predetermined time and generate the column address BIST signals AX_BIST_BO<14:3> by using the generated BIST count clock BIST_CNT_CK. Therefore, the column address BIST signals AX_BIST_BO<14:3> may be generated in the same manner as column addresses of the sensing data SEN_DATA<15:0> in consideration of the read time of the sensing data SEN_DATA<15:0> and the comparison operation time between the sensing data SEN_DATA<15:0> and the test pattern data EXP_DATA<15:0>.

The latch enable signal generating circuit 450 may generate and output the latch enable signals PINB_BO<15:0> for latching and outputting the column address BIST signals AX_BIST_BO<15:0> corresponding to a column in which a failure occurs to the input/output circuit 250 of FIG. 3 in response to the fail mask signal BIST_FAIL_MASK and the BIST count clock BIST_CNT_CK.

The fail information generating circuit 460 may generate and output the column address BIST signals AX_BIST_BO<0> and AX_BIST_BO<15> in response to the input/output strobe signal IOSTB, the high byte fail information HB_SUM and the low byte fail information LB_SUM.

The BIST circuit 400 may output the latch enable signals PINB_BO<15:0> and the column address BIST signals AX_BIST_BO<15:0> to the input/output circuit 250 of the internal circuit 500.

During a test operation, the input/output circuit 250 may selectively latch only a column address in which a failure occurs, among the column address BIST signals AX_BIST_BO<15:0> received from the BIST circuit 400 of FIG. 2, in response to the latch enable signals PINB_BO<15:0>, and may output the latched fail column address Fail_col_add to outside.

As described above, according to the present disclosure, during a self test operation, status information according to the logic signal LOGIC_IO indicating a test operation result may be acquired, and a column address of a fail cell may also be obtained when the fail cell is detected as the test operation result. Therefore, a column repair operation may be performed using a column address of a fail cell.

Figure 14:
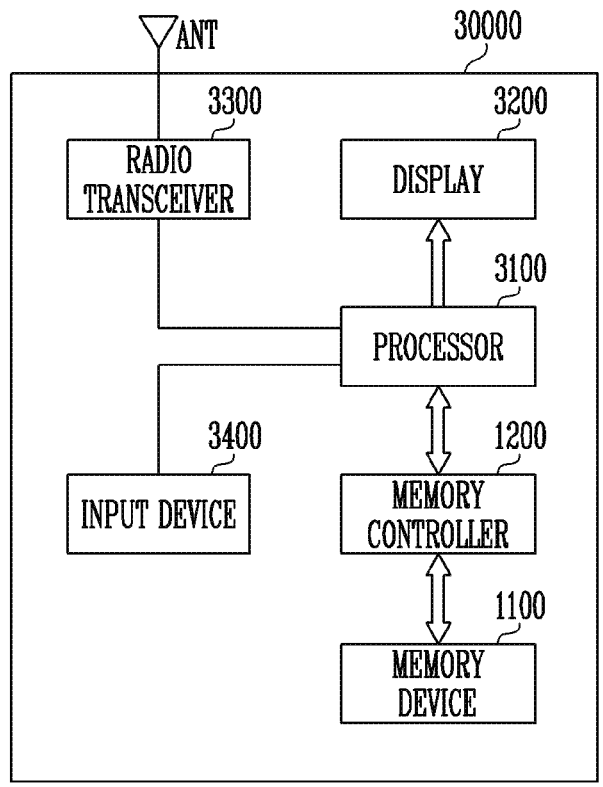
FIG. 14 is a diagram illustrating an embodiment of a memory system including a memory device shown in FIG. 2.

FIG. 14 is a diagram illustrating an embodiment of a memory system 30000 including the memory device 1100 shown in FIG. 2.

Referring to FIG. 14, the memory system 30000 may be embodied into a cellular phone, a smart phone, a tablet PC, a personal digital assistant (PDA), or a wireless communication device. The memory system 30000 may include the memory device 1100 and the memory controller 1200 controlling the operations of the memory device 1100. The memory controller 1200 may control a data access operation of the memory device 1100, for example, a program operation, an erase operation or a read operation in response to control of the processor 3100.

The memory controller 1200 may control data programmed into the memory device 1100 to be output through a display 3200 in response to control of the memory controller 1200.

A radio transceiver 3300 may exchange a radio signal through an antenna ANT. For example, the radio transceiver 3300 may change the radio signal received through the antenna ANT into a signal which can be processed by the processor 3100. Therefore, the processor 3100 may process the signal output from the radio transceiver 3300 and transfer the processed signal to the memory controller 1200 or the display 3200. The memory controller 1200 may program the signal processed by the processor 3100 into the memory device 1100. In addition, the radio transceiver 3300 may change a signal output from the processor 3100 into a radio signal, and output the radio signal to an external device through the antenna ANT. A control signal for controlling the operations of the processor 3100 or data to be processed by the processor 3100 may be input by the input device 3400, and the input device 3400 may include a pointing device, such as a touch pad and a computer mouse, a keypad, or a keyboard. The processor 3100 may control the operations of the display 3200 so that data output from the memory controller 1200, data output from the radio transceiver 3300, or data output from an input device 3400 may be output through the display 3200.

According to an embodiment, the memory controller 1200 controlling the operations of the memory device 1100 may form part of the processor 3100, or be formed as a separate chip from the processor 3100.

Figure 15:
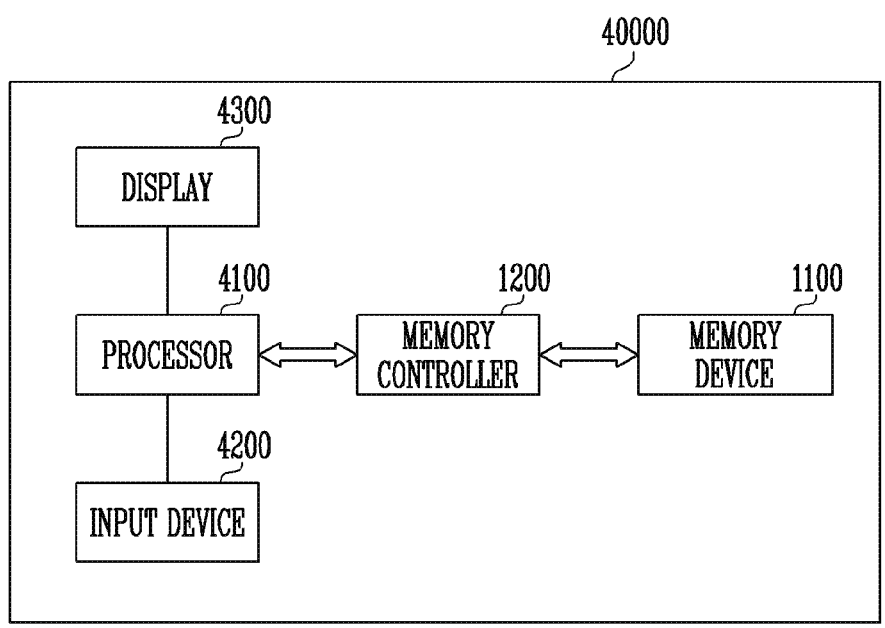
FIG. 15 is a diagram illustrating an embodiment of a memory system 40000 including a memory device shown in FIG. 2.

FIG. 15 is a diagram illustrating an embodiment of the memory system 40000 including the memory device 1100 shown in FIG. 2.

Referring to FIG. 15, a memory system 40000 may be provided as a personal computer (PC), a tablet, a net-book, an e-reader, a personal digital assistant (PDA), a portable multimedia player (PMP), an MP3 player, or an MP4 player The memory system 40000 may include the memory device 1100 and the memory controller 1200 controlling a data processing operation of the memory device 1100.

A processor 4100 may output data stored in the memory device 1100 through a display 4300 according to data input through an input device 4200. Examples of the input device 4200 may include a pointing device such as a touch pad or a computer mouse, a keypad, or a keyboard.

The processor 4100 may control the general operations of the memory system 40000 and control the operations of the memory controller 1200. According to an embodiment, the memory controller 1200 controlling the operations of the memory device 1100 may be part of the processor 4100, or be formed as a separate chip from the processor 4100.

Figure 16:
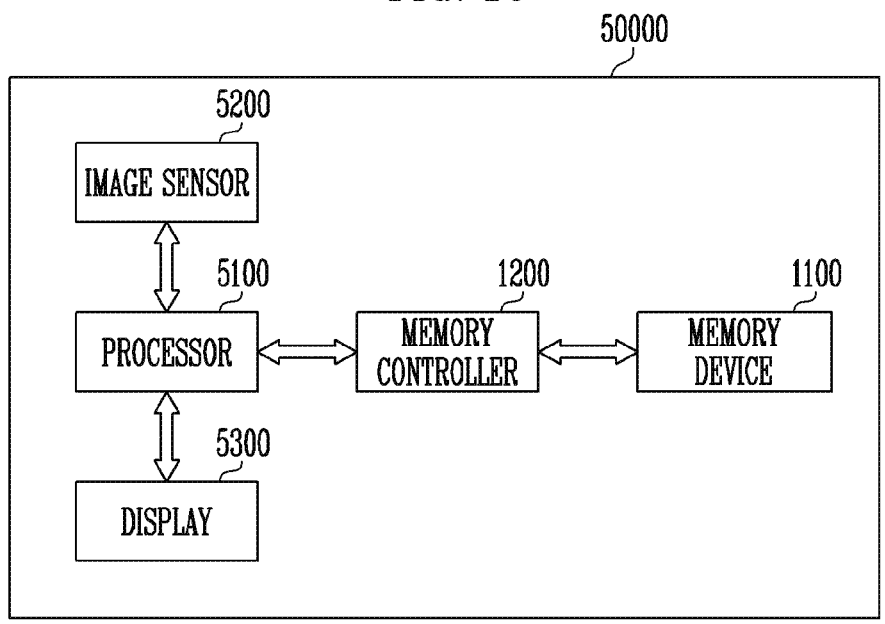
FIG. 16 is a diagram illustrating an embodiment of a memory system 50000 including a memory device shown in FIG. 2.

FIG. 16 is a diagram illustrating an embodiment of the memory system 50000 including the memory device 1100 shown in FIG. 2.

Referring to FIG. 16, a memory system 50000 may be provided as an image processing device, for example, a digital camera, a mobile phone attached with a digital camera, a smart phone attached with a digital camera, or a tablet PC attached with a digital camera.

The memory system 50000 may include the memory device 1100 and the memory controller 1200 controlling a data processing operation of the memory device 1100, for example, a program operation, an erase operation or a read operation.

An image sensor 5200 of the memory system 50000 may convert an optical image into digital signals, and the converted digital signals may be transferred to the processor 5100 or the memory controller 1200. In response to control of the processor 5100, the converted digital signals may be output through the display 5300 or stored in the memory device 1100 through the memory controller 1200. In addition, the data stored in the memory device 1100 may be output through the display 5300 according to control of the processor 5100 or the memory controller 1200.

According to an embodiment, the memory controller 1200 controlling the operations of the memory device 1100 may be part of the processor 5100, or be formed as a separate chip from the processor 5100.

Figure 17:
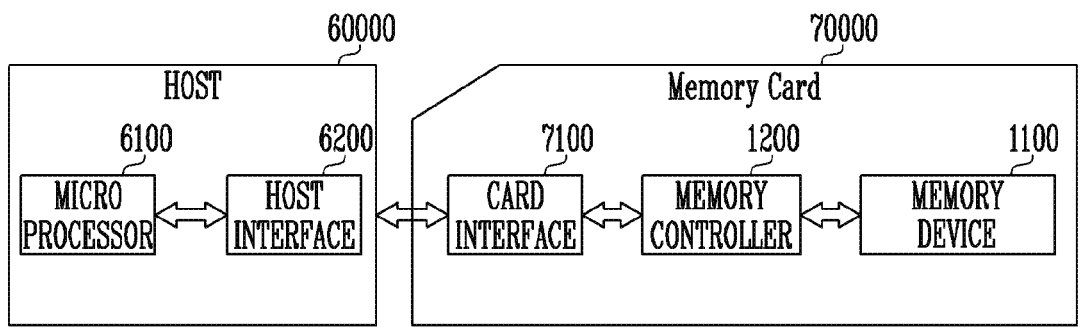
FIG. 17 is a diagram illustrating an embodiment of a memory system 70000 including a memory device shown in FIG. 2.

FIG. 17 is a diagram illustrating an embodiment of the memory system 70000 including the memory device 1100 shown in FIG. 2.

Referring to FIG. 17, a memory system 70000 may include a memory card or a smart card. The memory system 70000 may include the memory device 1100, the memory controller 1200, and a card interface 7100.

The memory controller 1200 may control data exchange between the memory device 1100 and the card interface 7100. According to an embodiment, the card interface 7100 may be, but not limited thereto, a secure digital (SD) card interface or a multi-media card (MMC) interface.

The card interface 7100 may interface data exchange between a host 60000 and the memory controller 1200 according to a protocol of the host 60000. According to an embodiment, the card interface 7100 may support a Universal Serial Bus (USB) protocol and an InterChip (IC)-USB protocol. The card interface may refer to hardware capable of supporting a protocol which is used by the host 60000, software installed in the hardware, or a signal transmission method.

When the memory system 70000 is connected to an host interface 6200 of the host 60000 such as a PC, a tablet PC, a digital camera, a digital audio player, a cellular phone, a console video game hardware, or a digital set-top pox, the host interface 6200 may perform data communication with the memory device 1100 through the card interface 7100 and the memory controller 1200 in response to control of the microprocessor 6100.

According to the present disclosure, a column address in which a failure occurs may be generated and output during a test operation of a memory device.

It will be apparent to those skilled in the art that various modifications can be made to the above-described examples of embodiments without departing from the spirit or scope of the disclosure.

It should be understood that many variations and modifications of the concepts described herein will still fall within the spirit and scope of the present disclosure as defined in the accompanying claims and equivalents thereof.

In the above-discussed embodiments, all steps may be selectively performed or skipped. In addition, the steps in each embodiment may not always be performed in regular order. Furthermore, the embodiments disclosed in the present specification and the drawings aims to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the concepts described herein will still fall within the spirit and scope of the present disclosure as defined in the accompanying claims and equivalents thereof.

What is claimed is:

1. A memory device, comprising:
   a comparison circuit configured for comparing test pattern data with sensing data to generate a comparison signal;
   a status information generating circuit configured for generating a fail mask signal by marking data in which a failure occurs in the sensing data in response to the comparison signal;
   a column address generating circuit configured for generating column addresses sequentially increasing in response to an input or output (input/output) strobe signal;
   a latch enable signal generating circuit configured for generating a latch enable signal in response to the fail mask signal; and
   an input/output circuit configured for receiving the column addresses and selectively latching a column address in which a failure occurs among the column addresses in response to the latch enable signal.

2. The memory device of claim 1, further comprising a test pattern generating circuit configured for generating the test pattern data.

3. The memory device of claim 2, further comprising an internal circuit configured for programming a memory block with the test pattern data generated by the test pattern generating circuit and outputting the sensing data by performing a read operation on the memory block.

4. The memory device of claim 1, wherein the comparison circuit comprises:
a low byte comparison circuit configured for comparing low byte sensing data of the sensing data with low byte test pattern data of the test pattern data to output low byte fail information;
a high byte comparison circuit comparing high byte sensing data of the sensing data with high byte test pattern data of the test pattern data to output high byte fail information; and
a logic gate configured for generating the comparison signal in response to the low byte fail information and the high byte fail information.

5. The memory device of claim 1, wherein the status information generating circuit includes a logic signal generating circuit configured for generating a logic signal indicating a test operation result, and
the logic signal generating circuit generates and outputs the logic signal fixed to a status fail value when a logic level of the logic signal transitions to a logic level corresponding to the status fail value.

6. The memory device of claim 5, wherein the status information generating circuit further comprises a fail mask signal generating circuit, and
the status information generating circuit generates the fail mask signal in response to the input/output strobe signal and the comparison signal.

7. The memory device of claim 1, wherein the column address generating circuit comprises:
a delay circuit configured for delaying the input/output strobe signal by a predetermined time to generate a built-in self test (BIST) count clock; and
a column address counter configured for counting the BIST count clock to generate and output the column addresses increasing sequentially.

8. The memory device of claim 7, wherein the predetermined time is set according to a read time of the sensing data and a comparison operation time of the sensing data and the test pattern data.

9. The memory device of claim 1, wherein the input/output circuit comprises:
a selection circuit configured for receiving and outputting normal data read by the internal circuit during a normal operation in response to a BIST enable signal, and receiving and outputting the column addresses output from the column address generating circuit during a test operation; and
a latch circuit configured for latching the normal data or the column addresses output from the selection circuit.

10. The memory device of claim 9, wherein the latch circuit comprises a plurality of latches, and
the plurality of latches configured for selectively latching only a column address in which a failure occurs, among the column addresses, to output the column address as a fail column address in response to the latch enable signal during the test operation.

11. A memory device, comprising:
an internal circuit configured for programming a selected memory block with test pattern data and outputting sensing data by reading the selected memory block programmed with the test pattern data during a test operation; and
a built-in self test (BIST) circuit configured for generating the test pattern data, and generating a latch enable signal for latching column addresses increasing sequentially, and column addresses in which failures occur, during the test operation,
wherein the internal circuit selectively latches only a column address in which a failure occurs, among the column addresses, to output a column address, in which a failure occurs, as a fail column address in response to the latch enable signal during the test operation.

12. The memory device of claim 11, wherein the BIST circuit comprises:
a test pattern generating circuit configured for generating the test pattern data;
a comparison circuit configured for comparing the test pattern data with the sensing data to generate a comparison signal;
a status information generating circuit configured for generating a fail mask signal by marking data in which a failure occurs in the sensing data in response to the comparison signal;
a column address generating circuit configured for generating column addresses sequentially increasing in response to an input or output (input/output) strobe signal; and
a latch enable signal generating circuit configured for generating the latch enable signal in response to the fail mask signal.

13. The memory device of claim 12, wherein the comparison circuit comprises:
a low byte comparison circuit configured for comparing low byte sensing data of the sensing data with low byte test pattern data of the test pattern data to output low byte fail information;
a high byte comparison circuit configured for comparing high byte sensing data of the sensing data with high byte test pattern data of the test pattern data to output high byte fail information; and
a logic gate configured for generating the comparison signal in response to the low byte fail information and the high byte fail information.

14. The memory device of claim 12, wherein the status information generating circuit includes a logic signal generating circuit configured for generating a logic signal indicating a test operation result by comparing the test pattern data with the sensing data, and
the logic signal generating circuit generates and outputs the logic signal fixed to a status fail value when a logic level of the logic signal transitions to a logic level corresponding to the status fail value.

15. The memory device of claim 14, wherein the status information generating circuit further comprises a fail mask signal generating circuit, and
the status information generating circuit generates the fail mask signal in response to the input/output strobe signal and the comparison signal.

16. The memory device of claim 12, wherein the column address generating circuit comprises:
a delay circuit configured for delaying the input/output strobe signal by a predetermined time to generate a BIST count clock; and
a column address counter configured for counting the BIST count clock to generate and output the column addresses increasing sequentially.

17. The memory device of claim 16, wherein the predetermined time is set according to a read time of the sensing data and a comparison operation time of the sensing data and the test pattern data.

18. The memory device of claim 12, wherein the input/output circuit comprises:
a selection circuit configured for receiving and outputting normal data read by the internal circuit during a normal operation in response to a BIST enable signal, and receiving and outputting the column addresses output from the column address generating circuit during a test operation; and a latch circuit configured for latching the normal data or the column addresses output from the selection circuit.

19. The memory device of claim 18, wherein the latch circuit comprises a plurality of latches, and the plurality of latches configured for selectively latching only the column address in which the failure occurs, among the column addresses, to output the column address as the fail column address in response to the latch enable signal during the test operation.

20. An operating method of a memory device, the operating method comprising:

programming a selected memory block with pattern data during a self test operation;

generating a logic signal including status information by comparing sensing data obtained by reading the selected memory block with the test pattern data;

generating a fail mask signal by marking data in which a failure occurs in the sensing data, and generating a latch enable signal by using the fail mask signal;

generating a plurality of column addresses sequentially increasing by using a count clock by delaying an input or output (input/output) strobe signal by a predetermined time; and selectively outputting a column address in which a failure occurs, among the plurality of column addresses, as a fail column address in response to the latch enable signal.

\* \* \* \* \*